(12) United States Patent
Nishino et al.

(10) Patent No.: US 10,501,628 B2
(45) Date of Patent: Dec. 10, 2019

(54) RESIN COMPOSITION, AND ELECTRONIC COMPONENT AND ELECTRONIC DEVICE USING SAME

(71) Applicant: Panasonic Intellectual Property Management Co., Ltd., Osaka (JP)

(72) Inventors: Honami Nishino, Osaka (JP); Hirohisa Hino, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 92 days.

(21) Appl. No.: 15/922,841

(22) Filed: Mar. 15, 2018

(65) Prior Publication Data

US 2018/0305546 A1    Oct. 25, 2018

(30) Foreign Application Priority Data

Apr. 19, 2017  (JP) .................. 2017-083151

(51) Int. Cl.
| | |
|---|---|
| *C08L 83/04* | (2006.01) |
| *H05K 7/20* | (2006.01) |
| *C08K 3/22* | (2006.01) |
| *C08K 3/14* | (2006.01) |
| *C08K 3/36* | (2006.01) |
| *H05K 1/03* | (2006.01) |

(52) U.S. Cl.
CPC .............. *C08L 83/04* (2013.01); *C08K 3/14* (2013.01); *C08K 3/22* (2013.01); *C08K 3/36* (2013.01); *H05K 7/2039* (2013.01); *C08K 2003/2217* (2013.01); *C08K 2003/2227* (2013.01); *C08K 2201/003* (2013.01); *C08K 2201/006* (2013.01); *C08L 2203/20* (2013.01); *H05K 1/03* (2013.01)

(58) Field of Classification Search
CPC ..... C08K 3/34; C08K 2201/001; C08L 83/04; C08L 83/06; C08L 83/08
See application file for complete search history.

(56) References Cited

U.S. PATENT DOCUMENTS

| | | | |
|---|---|---|---|
| 6,570,099 B1 | 5/2003 | Hirano et al. | |
| 9,153,761 B2 | 10/2015 | Takayama et al. | |
| 10,000,680 B2 * | 6/2018 | Bhagwagar | C09K 5/14 |
| 2003/0148079 A1 | 8/2003 | Hirano et al. | |
| 2005/0049350 A1 | 3/2005 | Tonapi et al. | |
| 2005/0049357 A1 | 3/2005 | Zhong et al. | |
| 2005/0148721 A1 | 7/2005 | Tonapi et al. | |
| 2014/0252404 A1 | 9/2014 | Takayama et al. | |

FOREIGN PATENT DOCUMENTS

| | | |
|---|---|---|
| JP | 2001-203313 | 7/2001 |
| JP | 2007-503506 | 2/2007 |
| JP | 2013-209508 | 10/2013 |
| WO | 2013/057889 | 4/2013 |

OTHER PUBLICATIONS

Article entitled Total Hemispherical Emissivity of Sintered SiC up to 1850 K in High Vacuum and in Air at Different Pressures authored by Balat-Pichelin et al. and published in the Journal of the European Ceramic Society (2018) 38, 3447-3456.*

* cited by examiner

*Primary Examiner* — Marc S Zimmer
(74) *Attorney, Agent, or Firm* — Wenderoth, Lind & Ponack, L.L.P.

(57) ABSTRACT

A resin composition having excellent heat dissipation can be used in an electronic component and an electronic device. The resin composition includes a silicone resin, an inorganic filler, and an inorganic pigment particle. The inorganic filler includes a first filler having thermal emissivity, and a second filler having thermal conductivity. The second filler is contained in a volume ratio of 2.5 or more and 4.0 or less with respect to the first filler. The inorganic filler is contained in a proportion of 46.8 volume % or more and 76.3 volume % or less with respect to the combined volume of the silicone resin, the inorganic filler, and the inorganic pigment particle.

10 Claims, 3 Drawing Sheets

RESIN COMPOSITION, AND ELECTRONIC COMPONENT AND ELECTRONIC DEVICE USING SAME

TECHNICAL FIELD

The technical field relates to a resin composition having excellent heat dissipation, and to electronic components and electronic devices using same.

BACKGROUND

The heat density of power devices and semiconductor packages has increased along with miniaturization and increased density of these devices. Electronic components installed in these devices thus require a technique that efficiently dissipates the generated heat of individual components to keep the components below the designed operating temperature. Fins that take advantage of convection, and heat conducting sheets that take advantage of heat conduction are commonly used as means to dissipate generated heat from individual components. However, with the sole use of the traditional approach using heat dissipating means such as above, it is difficult to keep a heat generating device below the designed operating temperature in a high heat-density environment.

Heat-dissipating coating materials and heat-dissipating sheets that take advantage of thermal radiation are available as resin compositions have attracted interest as a means to dissipate heat without requiring additional space. Among such resin compositions, heat-dissipating coating materials and heat-dissipating sheets with imparted thermal conductivity have considerably high heat dissipation with their ability to efficiently transfer the generated heat from a heat generating component on the inside and release the heat to the outside through the surface opposite the heat generating component.

FIG. 6 is a schematic cross sectional view of a resin composition produced by a traditional method. In order to prevent a heat spot due to heat generating portions of electronic devices and LED lights, a thermoplastic resin composition 18 is provided as a heat dissipating member by being installed on surfaces of these devices. For example, JP-A-2013-209508 describes a thermoplastic resin composition 18 that can be provided as a composition mixing a thermoplastic resin 15, a heat conductive filler 16, and a composite oxide 17.

However, in the thermoplastic resin composition 18 described in JP-A-2013-209508 (Patent Literature 1), the combined volume fraction of the heat conductive filler 16 and the composite oxide 17 with respect to the total volume of the thermoplastic resin 15 cannot be increased to 65 volume % or more for reasons related to moldability. Specifically, the thermoplastic resin composition 18 shown in Example 1 of Patent Literature 1 contains only 5 to 10 volume % of composite oxide 17 with respect to the total volume of the thermoplastic resin composition 18. The thermoplastic resin composition 18 shown in Patent Literature 1 is therefore probably insufficient in terms of dissipation of heat from the composition surface to outside.

SUMMARY

The present disclosure is intended to provide a solution to the problems of the related art, and it is an object of the present disclosure to provide a resin composition having excellent heat dissipation, and an electronic component and an electronic device using the same.

A resin composition according to an aspect of the present disclosure includes a silicone resin, an inorganic filler, and an inorganic pigment particle. The inorganic filler includes a first filler having thermal emissivity, and a second filler having thermal conductivity. The second filler is contained in a volume ratio of 2.5 or more and 4.0 or less with respect to the first filler. The inorganic filler is contained in a proportion of 46.8 volume % or more and 76.3 volume % or less with respect to a combined volume of the silicone resin, the inorganic filler, and the inorganic pigment particle.

The resin composition of the aspect of the present disclosure may be such that the first filler is an oxide having an average particle size of 7.8 μm or more and 18 μm or less, and containing at least two elements selected from the group consisting of aluminum, magnesium, and silicon, the second filler is a SiC having an average particle size of 9.5 μm or more and 25 μm or less, and a purity of 92% or more, and the inorganic pigment particle has an average particle size of 28 nm or more and 39.5 nm or less, and a specific surface area of 84 $m^2/g$ or more and 800 $m^2/g$ or less.

The resin composition of the aspect of the present disclosure may be such that the inorganic pigment particle is contained in a proportion of 0.1 parts by mass or more and 2.0 parts by mass or less with respect to 100 parts by mass of the silicone resin.

The present disclosure has therefore provided a resin composition having excellent heat dissipation, and an electronic component and an electronic device using the same.

DESCRIPTION OF EMBODIMENTS

Figure 1:
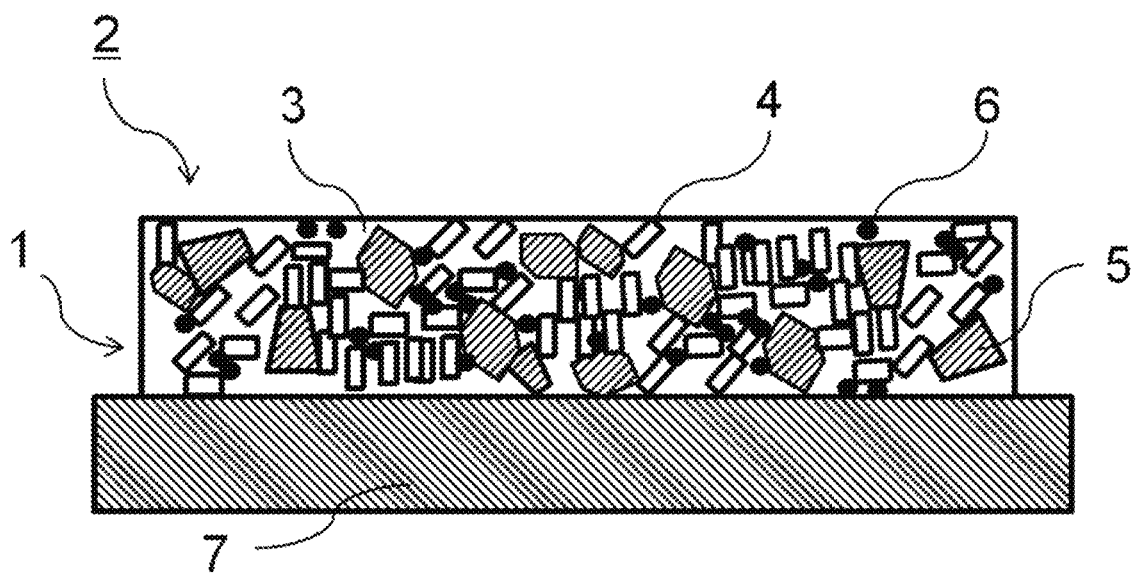
FIG. 1 is a schematic cross sectional view of a heat generating device provided with a resin composition of an embodiment of the present disclosure.
Figure 2:
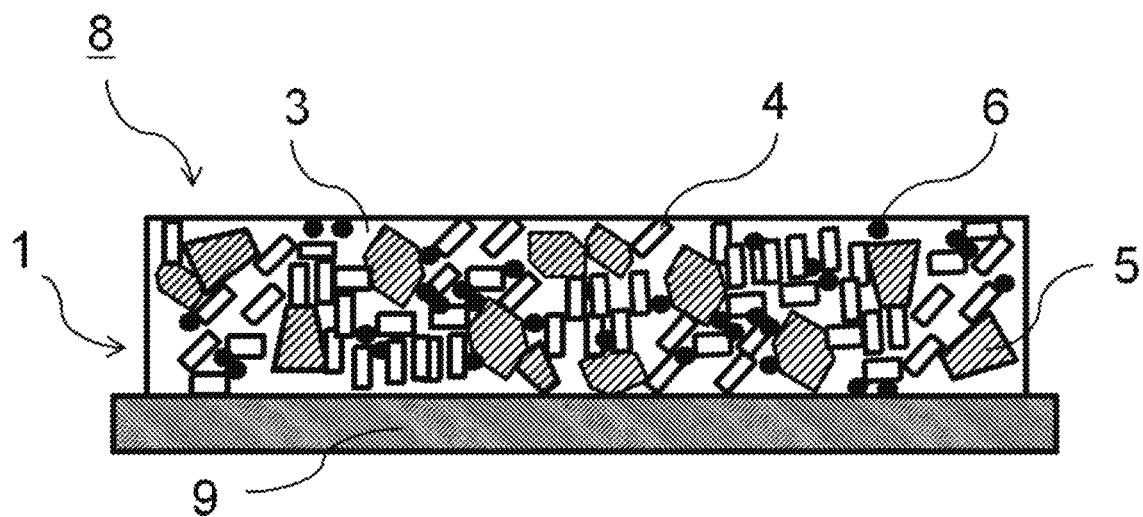
FIG. 2 is a schematic cross sectional view of a heat dissipation evaluation device provided with a resin composition of an embodiment of the present disclosure.

FIG. 1 is a schematic cross sectional view of a heat generating device that includes a resin composition of an embodiment of the present disclosure. A resin composition 1 of an embodiment of the present disclosure includes a silicone resin 3, an inorganic filler, and inorganic pigment particles 6. The inorganic filler includes a first filler 4 having thermal emissivity and a second filler 5 having thermal conductivity. The following specifically describes these components.

Silicone Resin 3

As used herein, silicone resin 3 refers to a resin having a siloxane linkage in its main chain. With the silicone resin 3 contained in the resin composition 1, the resin composition 1 can form a coating that includes the inorganic first filler 4 and second filler 5, and the inorganic pigment particles 6.

The resin composition 1 of the embodiment of the present disclosure is formed by curing the coating formed. The silicone resin 3 may be any silicone resin, provided that the first filler 4 and the second filler 5, and the inorganic pigment particles 6 can be mixed therein, and that the silicone resin 3 can be cured. Because the heat generating device 7 is often metal, particularly preferred as a silicone resin 3 is a resin having high adhesion for metal. Examples of materials that can be used as silicone resin 3 in the present disclosure include dimethyl silicone, methylphenyl silicone, and methylhydrogen silicone. Modified silicone resins, such as epoxy-modified, and diamine-modified silicone resins also may be used. However, the silicone resin 3 is not limited to these, and any silicone resin may be used. More preferably, the silicone resin 3 may be dimethyl silicone, or epoxy-modified silicone. Preferably, the silicone resin 3 is contained in the resin composition 1 in a proportion of 23.2 volume % or more and 52.1 volume % or less with respect to the total volume of the resin composition 1.

Inorganic Filler

As used herein, inorganic filler refers to particles, for example, ceramic particles, that are added to the resin. With the inorganic filler contained in the resin composition 1, generated heat in the heat generating device 7 can efficiently transfer in the resin composition 1, and release to the atmosphere. The inorganic filler is contained in an amount of preferably 46.8 volume % or more and 76.3 volume % or less with respect to the total mass of the resin composition 1. With an inorganic filler content of 46.8 volume % or more, the inorganic fillers in the resin composition 1 more easily contact one another and increase the thermal conductivity in the resin composition 1. This improves the thermal radiation efficiency at the surface layer of the resin composition 1. With an inorganic filler content of 76.3 volume % or less, the area of contact between the heat generating device 7 and the silicone resin 3 becomes sufficient, and the adhesion of the resin composition 1 for the heat generating device improves. In the embodiment of the present disclosure, the inorganic filler includes the first filler 4 having thermal emissivity, and the second filler 5 having thermal conductivity.

Mixture Ratio of First Filler 4 and Second Filler 5

The first filler 4 and the second filler 5 are contained in the resin composition of the embodiment of the present disclosure in such proportions that the volume ratio of the second filler 5 to the first filler 4 is 2.5 to 4.0. With the second filler 5 contained in a volume ratio of 2.5 or more with respect to the first filler 4, the content of the second filler 5 does not become overly small, and the resin composition 1 can have sufficient thermal conductivity, making it possible to maintain thermal radiation efficiency at the surface layer of the resin composition 1. With the second filler 5 contained in a volume ratio of 4.0 or less with respect to the first filler 4, the proportion of the first filler 4 distributed in the surface layer of the resin composition 1 does not become overly small, and thermal radiation efficiency can be maintained at the surface layer of the resin composition 1. The following describes the first filler 4 and the second filler 5 in greater detail.

First Filler 4

The first filler 4 is an inorganic filler having thermal emissivity. As used herein, "thermal emissivity" refers to a property to dissipate heat by means of thermal radiation, a form of heat transfer. With the thermally emissive first filler 4 contained in the resin composition 1, generated heat from the heat generating device 7 can efficiently radiate into air from the surface of the resin composition 1. In the specification, thermal emissivity can be evaluated by measuring far infrared emissivity using, for example, a simple emissivity measurement device. However, the method of measurement is not limited to this, and any other method may be used. For example, the far infrared emissivity of the first filler 4 is preferably 0.8 or more in a wavelength region of 5 to 20 μm, a region of wavelength that contributes to the heat transfer of an electronic component 2. Here, "far infrared emissivity" takes a value of 0 to 1 relative to an ideal state, where the value 1 represents black-body radiation closest to an ideal state. The far infrared emissivity of the resin composition 1 is affected not only by the first filler 4 near the surface of the resin composition 1, but by the silicone resin 3. The silicone resin 3 has a far infrared emissivity of typically 0.6 to 0.8. It is therefore preferable that the first filler 4 have a far infrared emissivity of 0.8 or more, a value larger than the far infrared emissivity of the silicone resin 3. With the first filler 4 having a far infrared emissivity of 0.8 or more in a wavelength region of 5 to 20 μm—a region of wavelength that contributes to the heat transfer of the electronic component 2—the far infrared emissivity of the resin composition 1 becomes less likely to be affected by the far infrared emissivity of the silicone resin 3, and the resin composition 1 can have sufficient thermal radiation efficiency.

In order for the resin composition 1 to have a far infrared emissivity of 0.9 or more, the first filler 4 is preferably an oxide that contains at least two elements selected from the group consisting of aluminum, magnesium, and silicon. With the first filler 4 being an oxide such as above, the peak of the far infrared emissivity due to the composition overlaps. This makes it possible to make the mean value of far infrared emissivity 0.9 or more in a wavelength region of 5 to 20 μm, a region of wavelength that contributes to the heat transfer of the electronic component 2. The first filler 4 as an oxide that contains at least two elements selected from the group consisting of aluminum, magnesium, and silicon is preferably a magnesium silicate such as talc and cordierite, a magnesium-aluminum carbonate such as hydrotalcite, or an aluminosilicate such as zeolite and bentonite. By using such an oxide, the first filler 4 can also show a desirable thermal conductivity characteristic.

The first filler 4 has an average particle size of preferably 7.8 μm to 18 μm. With the first filler 4 having an average particle size of 7.8 μm or more, the particle surface area does not become overly large, and desirable wettability can be maintained for the silicone resin 3 during kneading. This makes it possible to sufficiently knead the silicone resin 3 and the first filler 4, and the inorganic filler exists as an aggregate, preventing the resin composition 1 from having an insufficient thermal conductivity. With the first filler 4 having an average particle size of 18 μm or less, the first filler 4 is significantly smaller than the second filler 5, and becomes more likely to distribute itself near the surface of the resin composition 1 opposite the surface contacting the heat generating device 7. Thus, the efficiency of thermal radiation into the atmosphere is improved.

As used herein, "average particle size" is the particle size (D50) at a cumulative 50% point on a cumulative curve with respect to a total 100% volume in a volume-based particle size distribution. Average particle size can be measured using a laser-diffraction scattering particle-size and particle-distribution measurement device, or a scanning electron microscope.

The first filler 4 of the embodiment of the present disclosure is preferably an inorganic filler having a thermal conductivity of 3.0 W/m·K or more. With the first filler 4 of the embodiment of the present disclosure having such a desirable thermal conductivity, generated heat from the heat generating device 7 can efficiently transfer in a direction along the thickness of the composition.

Second Filler 5

The second filler 5 is an inorganic filler having thermal conductivity. As used herein, "thermal conductivity" refers to a property to dissipate heat by means of heat conduction, a form of heat transfer. With the thermally conductive second filler 5 contained in the resin composition 1, generated heat from the heat generating device 7 can efficiently transfer in a direction along the thickness of the composition, away from the heat generating device 7. This makes it possible to reduce temperature increase of the heat generating device 7. In the specification, thermal conductivity also can be evaluated by evaluating the purity of SiC.

The second filler 5 is preferably a SiC having a purity of at least 92%, preferably 96% or more. The SiC used as the second filler 5 can have fewer impurities when purified by a chemical treatment. With the second filler 5 being a SiC having a purity of at least 92%, the second filler 5 can have a thermal conductivity of more than 200 W/m·K, and the resin composition 1 can have desirable thermal conductivity. By using a SiC having such a purity, the second filler 5 also can show a desirable thermal emissivity characteristic.

The second filler 5 has an average particle size of preferably 9.5 μm to 25 μm. With the second filler 5 having an average particle size of 9.5 μm or more, the second filler 5 is significantly larger than the first filler 4, and the second filler 5 becomes more likely to distribute itself near the surface of the resin composition 1 containing the heat generating device 7. This makes it possible to efficiently transfer the generated heat from the heat generating device 7 into the resin composition 1. With the second filler 5 having an average particle size of 25 μm or less, the second filler 5 becomes less likely to have a gap between second filler particles, and can prevent reduction of thermal conductivity in the resin composition 1. Preferably, the average particle size of the second filler 5 is larger than the average particle size of the first filler 4.

The second filler 5 of the embodiment of the present disclosure is preferably an inorganic filler having a far infrared emissivity of 0.8 or more in a wavelength region that contributes to the heat transfer of the electronic component 2. With the second filler 5 of the embodiment of the present disclosure having such a desirable thermal emissivity, generated heat from the heat generating device 7 can efficiently radiate into air from the surface of the resin composition 1, even when the second filler 5 is filling the resin composition 1 near the surface contacting the atmosphere.

Inorganic Pigment Particle 6

As used herein, "inorganic pigment particle" refers to a pigment that contains an inorganic substance as a color component. With the inorganic pigment particles 6 contained in the resin composition 1, the inorganic fillers in the resin composition 1 can conduct heat via the inorganic pigment particles 6, and the thermal conductivity in a thickness direction of the composition increases, increasing the ability to reduce temperature increase.

The inorganic pigment particles 6 have an average particle size of preferably 28 nm to 39.5 nm. With the inorganic pigment particles 6 having an average particle size of 28 nm or more, the particle surface area does not become overly large, and desirable wettability can be maintained for the silicone resin 3 during kneading. This makes it possible to sufficiently knead the silicone resin 3 and the inorganic pigment particles 6. The inorganic pigment particles 6 can also be prevented from existing as an aggregate. The inorganic pigment particles 6 also can be prevented from existing as an aggregate when it has an average particle size of 39.5 nm or less. In this way, the inorganic fillers can contact one another at larger numbers of contact points, either directly or via the inorganic pigment particles 6, and the thermal conductivity of the resin composition 1 can improve.

The inorganic pigment particles 6 have a specific surface area of preferably 84 m²/g to 800 m²/g. With the inorganic pigment particles 6 having a specific surface area of 84 m²/g or more, the surface of the resin composition 1 can have a larger heat dissipating area that contributes to thermal radiation, and the thermal radiation efficiency can improve. With a specific surface area of 800 m²/g or less, the particle surface area does not become overly large, and desirable wettability can be maintained for the silicone resin 3 during kneading. This makes it possible to sufficiently knead the silicone resin 3 and the inorganic pigment particles 6, and the inorganic pigment particles 6 can be prevented from existing as an aggregate. In this way, the inorganic fillers can contact one another at larger numbers of contact points, either directly or via the inorganic pigment particles 6, and the thermal conductivity of the resin composition 1 can improve. The specific surface area of the inorganic pigment particles 6 is the surface area per unit mass of the inorganic pigment particles 6 and can be measured using a gas adsorption method.

The particles used as the inorganic pigment particles 6 have a far infrared emissivity of preferably 0.7 or more. With the inorganic pigment particles 6 having a far infrared emissivity of 0.7 or more, generated heat from the heat generating device 7 can efficiently radiate into air from the surface of the resin composition 1. Specific examples of inorganic pigment particles 6 having a far infrared emissivity of 0.7 or more include carbon black, titanium black, and black iron oxide.

In a preferred embodiment, a resin composition of the present disclosure is one in which the first filler 4 is an oxide having an average particle size of 7.8 μm to 18 μm, and containing at least two elements selected from the group consisting of aluminum, magnesium, and silicon, the second filler 5 is a SiC having an average particle size of 9.5 μm to 25 μm, and a purity of 92% or more, and the inorganic pigment particles 6 have an average particle size of 28 nm to 39.5 nm, and a specific surface area of 84 m²/g to 800 m²/g. With the SiC having such a purity, the second filler 5 can have a desirable thermal conductivity of more than 200 W/m·K. With the foregoing range of average particle size, the second filler 5 becomes more likely to distribute itself near the surface of the resin composition 1 contacting the heat generating device 7, and generated heat from the heat generating device 7 can more easily transfer to the second filler 5. With the inorganic pigment particles 6 having the foregoing range of average particle size, the inorganic pigment particles 6 can be prevented from existing as an aggregate. This makes it possible to bring the inorganic pigment particles 6 and the second filler 5 closer to each other, and the transferred heat from the heat generating device 7 can more easily transfer from the second filler 5 to the inorganic pigment particles 6. Because the inorganic pigment particles 6 do not easily aggregate, the inorganic pigment particles 6 also can be brought closer to the first filler 4, and the transferred heat from the second filler 5 can more easily transfer from the inorganic pigment particles 6 to the first filler 4. With the first filler 4 having the foregoing range of average particle size, the first filler 4 can more easily distribute itself near the surface of the resin composition 1 opposite the surface contacting the heat generating device 7, and the efficiency of thermal radiation into the atmosphere can improve.

A resin composition of the present disclosure can be used by being applied to a surface of an existing electronic component. With an electronic component of the present disclosure having a resin composition of the present disclosure, temperature increase can be reduced in the electronic component generating heat.

Figure 5:
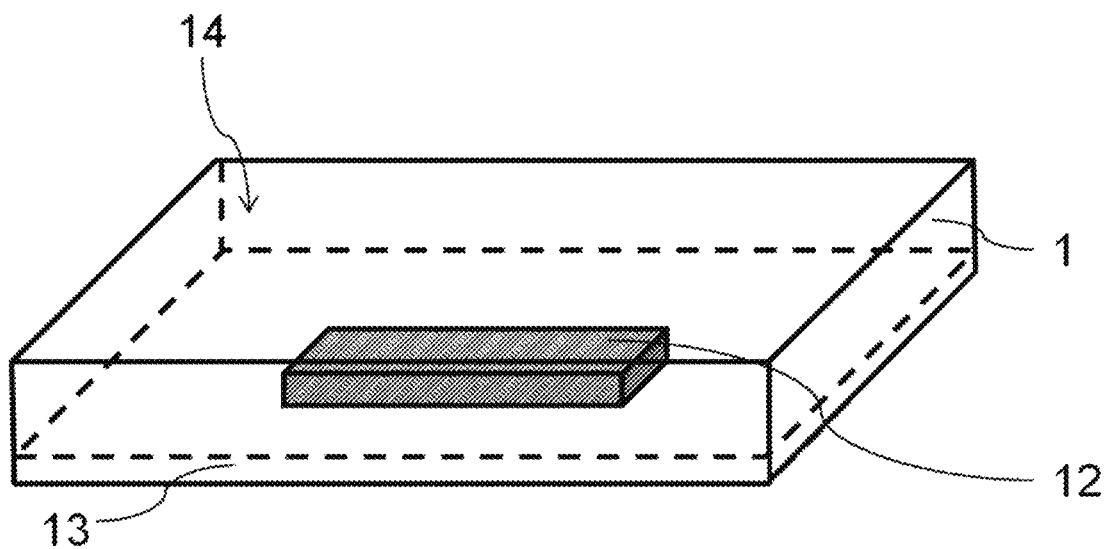
FIG. 5 is a perspective view of an electronic device of an embodiment of the present disclosure.
Figure 6:
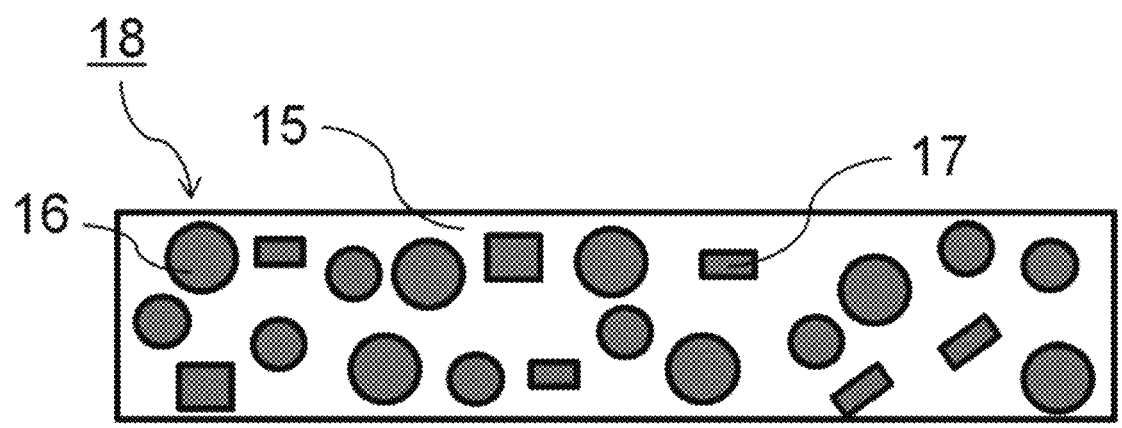
FIG. 6 is a schematic cross sectional view of a resin composition produced by a traditional method.

An electronic device of the present disclosure can include an electronic component of the present disclosure on a substrate inside the electronic device, for example, as shown in FIG. 5. Examples of an electronic device of the present disclosure include small, light, and thin devices such as smartphones and tablets, and security cameras, and digital cameras. The electronic device shown in FIG. 5 includes the resin composition 1, a heat generator 12, a substrate 13, and a tablet casing 14. By being provided with an electronic component of the present disclosure, an electronic device of the present disclosure can effectively achieve heat dissipation even when it cannot be equipped with a fan or a heatsink such as in the tablet casing 14.

EXAMPLES

Example 1

A cordierite (Marusu Glaze Co., Ltd.; SS-200) having a particle size of 7.8 μm was prepared as the first filler 4. For the second filler 5, a SiC (Pacific Rundum Co., Ltd.; GF-500H) having a purity of 99.8%, and a particle size of 25 μm was prepared. A base resin KJR-9022-5 was prepared as the silicone resin 3, along with a curing agent C-9022X-5 (Shin-Etsu Chemical Co., Ltd.). A carbon black (Lion Corporation; EC300J) having a particle size of 34 nm, and a specific surface area of 800 m²/g was prepared as the inorganic pigment particles 6. The silicone resin 3 was used in an amount of 3.0 parts by mass, and was mixed with 3.545 parts by mass of the first filler 4, 24.273 parts by mass of the second filler 5, and 0.003 parts by mass of the inorganic pigment particles 6 so that the resin composition obtained contained the inorganic filler in an amount of 90.2 mass % or more.

The density ratio $\rho_2/\rho_1$ of the second filler 5 to the first filler 4 in Example 1 is as represented by the following formula 1.

$$\frac{\rho_2}{\rho_1} = \frac{3.2}{1.7} \cong 1.88 \qquad \text{Formula 1}$$

The mixture produced contained 3.545 parts by mass of the first filler 4, and 24.273 parts by mass of the second filler 5, and the volume ratio $V_2/V_1$ of the second filler 5 to the first filler 4 in the product resin composition was calculated according to the following formula 2.

$$\frac{V_2}{V_1} = \frac{\frac{24.273}{\rho_2}}{\frac{3.545}{\rho_1}} \cong 3.6 \qquad \text{Formula 2}$$

The density ratio $\rho_1:\rho_2:\rho_3:\rho_4$ of the first filler 4, the second filler 5, the silicone resin 3, and the inorganic pigment particles 6 in Example 1 was 1.7:3.2:1.02:0.05. In addition to the first filler 4 and the second filler 5 contained in the foregoing amounts, the mixture also contained 3.000 parts by mass of the silicone resin 3, and 0.003 parts by mass of the inorganic pigment particles 6. Accordingly, the volume ratio $(V_1+V_2)/(V_3+V_1+V_2+V_4)$ of the inorganic filler to the combined volume of the silicone resin, the inorganic filler, and the inorganic pigment particle was calculated according to the following formula 3.

$$\frac{V_1+V_2}{V_3+V_1+V_2+V_4} = \frac{\frac{3.545}{\rho_1}+\frac{24.273}{\rho_2}}{\frac{3.000}{\rho_3}+\frac{3.545}{\rho_1}+\frac{24.273}{\rho_2}+\frac{0.003}{\rho_4}} \cong 76.3 \qquad \text{Formula 3}$$

The viscosity of the mixture was lowered to sufficiently knead the inorganic filler and the inorganic pigment particles 6 in the silicone resin 3. This was attained by adding toluene as a solvent and increasing dispersibility. The toluene was added in an amount of 40 mass % with respect to the mass of the mixture produced. The solvent was added for kneading, and the resin composition 1 does not contain toluene because the toluene completely evaporates during the coating curing step. The mixture was applied to a metal substrate 9 in a thickness of 60 μm using a metal mask and a squeegee, and was cured at 150° C. for 1 hour to produce a heat dissipation evaluation device 8, which is the metal substrate 9 provided with the resin composition 1. The coating had a thickness of 60 μm immediately after being applied. However, the resin composition 1 had a thickness of 36 μm after the solvent toluene in the silicone resin 3 had evaporated under the heat applied to cure the coating.

Figure 3:
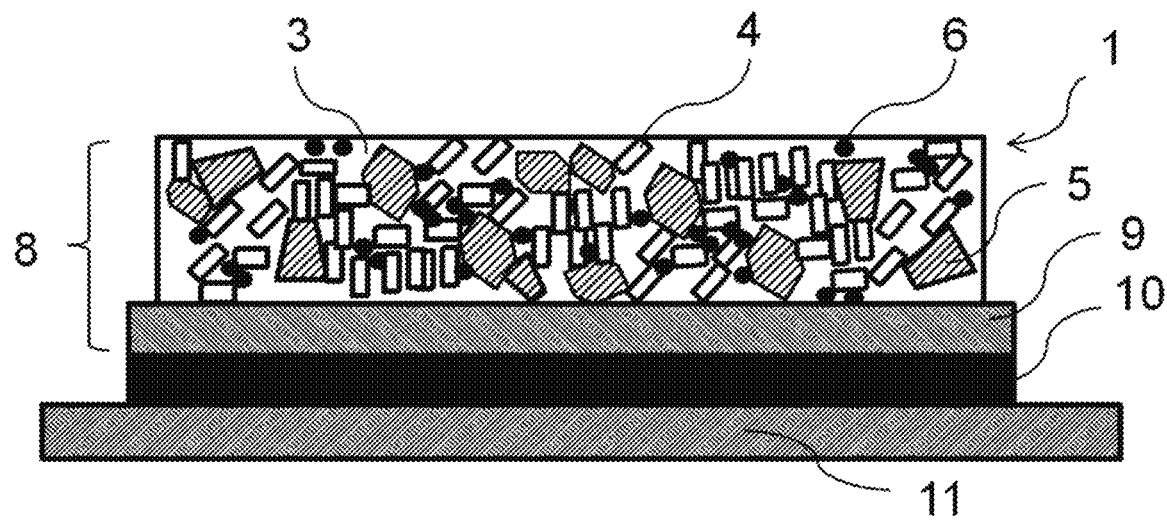
FIG. 3 is a schematic cross sectional view of a heat dissipation evaluation jig provided with a resin composition of an embodiment of the present disclosure.

The heat dissipation evaluation device 8 obtained using the procedures above was used to produce a heat dissipation evaluation jig. FIG. 3 is a cross sectional view of the heat dissipation evaluation jig produced. The heat dissipation evaluation jig is constructed from the heat dissipation evaluation device 8 obtained using the foregoing procedures, a heater 10, and a resin substrate 11. A 1 mm-thick, 60 mm×60 mm aluminum substrate was prepared as the metal substrate 9. The heater 10 is a thermocouple-embedded heater measuring 60 mm×60 mm in size with a thickness of 10 mm and was bonded to the back surface of the heat dissipation evaluation device 8 using a heat-dissipation silicone grease.

Examples 2 to 6

Figure 4:
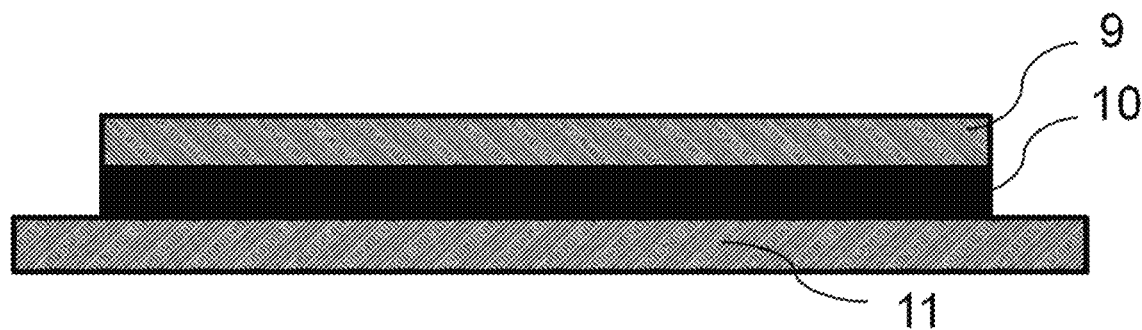
FIG. 4 is a schematic cross sectional view of a heat dissipation evaluation jig not provided with a resin composition of an embodiment of the present disclosure.

Heat dissipation evaluation devices 8 were produced using the same method, except that the conditions, including materials, amounts (parts by mass), and the particle size of the first and second fillers were varied as shown in Tables 1 to 3. The heat dissipation evaluation devices 8 produced were used as evaluation devices of Examples 2 to 6, and Comparative Examples 2 to 12. Heat dissipation evaluation jigs (FIG. 3) having the same dimensions as in Example 1 were produced using the heat dissipation evaluation devices 8 of Examples 2 to 6, and Comparative Examples 1 to 12. The same metal substrate 9, heater 10, and resin substrate 11 used in Example 1 were prepared, and a heat dissipation evaluation jig that was not coated with the resin composition 1 of the present disclosure was also produced, as shown in FIG. 4. The measured values of this heat dissipation evaluation jig are presented in Table 1 as Comparative Example 1.

The heat dissipation evaluation devices 8 of Examples 1 to 6 and Comparative Examples 1 to 12 were measured for far infrared emissivity using a simple emissivity measurement device (Model Number: TSS-5X; Japan Sensor Corporation). The far infrared emissivity was obtained as the average value of spectral far infrared emissivity in a wavelength region of 2 to 22 Samples that satisfied a far infrared emissivity of 0.9 or more were determined as "Good", and samples that did not satisfy this condition were determined as "Poor". The results are presented in Tables 1 to 3.

The heat dissipation evaluation jigs (FIG. 3) including the heat dissipation evaluation devices 8 of Examples 1 to 6 and Comparative Examples 1 to 12 were placed in a 25° C. thermostat bath, and current was passed through the heater In the present disclosure, the overall evaluation of heat dissipation was "Excellent" when the result was "Good" for both the far infrared emissivity measurement, and the temperature change measurement for reduction of temperature increase. The overall evaluation was "Poor" when the result was "Poor" in either of these measurements. The overall evaluation was "Good" for other results.

TABLE 1

| Main constituents | | Details | Ex. 1 | Ex. 2 | Com. Ex. 1 | Com. Ex. 2 | Com. Ex. 3 |
|---|---|---|---|---|---|---|---|
| Silicone resin | | Resin (base resin KJR-9022X-5:curing agent C-9022X-5 = 10:1) (parts by mass) | 3.000 | 3.000 | No composition coating | 3.000 | 3.000 |
| First filler | | Cordierite ($2MgO \cdot 2Al_2O_3 \cdot 5SiO_2$, SS-200, particle size 7.8 μm) (parts by mass) | 3.545 | 1.030 | | 3.545 | 3.545 |
| Second filler | | Silicon carbide (SiC) (GF-500H, purity 99.8%, particle size 25 μm) (parts by mass) | 24.273 | 7.700 | | 24.273 | 24.273 |
| Inorganic pigment particle | | Carbon black (particle size 34 nm, specific surface area 800 $m^2/g$) (parts by mass) | 0.003 | 0.060 | | — | 0.075 |
| | | Total mass of the constituents (parts by mass) | 30.821 | 11.790 | | 30.818 | 30.893 |
| | | Proportion of inorganic filler in total mass of the constituents (%) | 90.3 | 74.0 | | 90.3 | 90.0 |
| | | Volume ratio of second filler to first filler | 3.6 | 4.0 | | 3.6 | 3.6 |
| | | Volume ratio of inorganic filler with respect to combined volume of silicone resin, inorganic filler, and inorganic pigment particle | 76.3 | 54.8 | | 76.7 | 68.5 |
| | | Amount of inorganic pigment particle with respect to 100 parts by mass of silicone resin (parts by mass) | 0.1 | 2.0 | | — | 2.5 |
| Heat dissipating characteristics | Thermal emissivity (—) | Far infrared emissivity (—) | 0.94 | 0.91 | 0.09 | 0.89 | 0.94 |
| | | Evaluation (—) | Good | Good | Poor | Poor | Good |
| | Reduction of temperature increase | Measured value (° C.) | 120 | 121 | 127.5 | 124 | 124 |
| | | Temperature difference ΔT (° C.) | 7.5 | 6.5 | — | 3.5 | 3.5 |
| | | Percentage reduction of temperature increase (%): Heat dissipation | 5.9 | 5.1 | — | 2.7 | 2.7 |
| | Overall evaluation | Evaluation (—) | Good | Good | — | Poor | Poor |
| | | Evaluation (—) | Excellent | Excellent | — | Poor | Poor |

10 under no wind. The applied voltage to the heater 10 was kept increased until the heater 10 of Comparative Example 1 reached a temperature of 127.5° C. For the heaters 10 of Examples 1 to 6 and Comparative Examples 2 to 12, the temperature difference ΔT from the heater 10 of Comparative Example 1 at 127.5° C. was determined using the following formula 4.

ΔT=[127.5(° C.)–(temperature of each heater 10)(° C.)]   Formula 4

Temperature increase is reduced, and the temperature difference (ΔT) at 127.5° C. becomes 7.5° C. when the resin composition 1 of Example 1 is applied to the metal substrate 9.

Percentage reduction of temperature increase is represented by the following formula 5.

Percentage reduction of temperature increase=(ΔT)/127.5° C.   Formula 5

Many heat-dissipating coating materials using the silicone resin 3 have a percentage reduction of temperature increase of about 5%, and accordingly samples were determined as "Poor" when the percentage reduction of temperature increase was less than 3%, "Moderate" when the percentage reduction of temperature increase was 3% or more and less than 5%, and "Good" when the percentage reduction of temperature increase was 5% or more. The acceptable range of percentage reduction of temperature increase is 3% or more, where larger values are more desirable. Considering cost such as applying paste, a percentage reduction of temperature increase of less than 3% is not cost effective, through the effective value depends on the type of application.

Table 1 represents the results of the experiments conducted for Examples to examine how the presence or absence, and the content of the inorganic pigment particles 6 in the resin composition 1 affect the evaluation results.

In contrast to Example 1 in which the evaluation result was good for both thermal emissivity and reduction of temperature increase, Comparative Example 2 had poor evaluation results for both thermal emissivity and reduction of temperature increase. This is probably because mixing the inorganic pigment particles 6 allows the inorganic fillers in the resin composition 1 to conduct heat via the inorganic pigment particles 6 and increases the thermal conductivity in a thickness direction of the composition, thereby increasing the ability to reduce temperature increase. The result showed that mixing the inorganic pigment particles 6 with the first filler 4 and the second filler 5 was indeed desirable.

Examples 1 and 2 had good evaluation results for reduction of temperature increase, whereas the evaluation result for reduction of temperature increase was poor in Comparative Example 3. This is probably because of the inorganic pigment particles 6 being contained in an amount of 2.0 parts by mass or less with respect to the total 100 parts by mass of the silicone resin 3 in Examples 1 and 2. Presumably, by containing the inorganic pigment particles 6 in such a proportion, the viscosity of the mixture does not become overly high in kneading and producing the resin composition 1, and entry of voids becomes less likely to occur when applying the resin composition 1 to the metal substrate 9. This must have prevented decrease of thermal conductivity in the coating, and inhibited decrease of thermal emissivity. The result therefore showed that the desirable content of the inorganic pigment particles 6 was 0.1 parts by mass to 2.0 parts by mass with respect to the total 100 parts by mass of the silicone resin 3.

TABLE 2

| Main constituents | Details | Ex. 1 | Ex. 3 | Ex. 4 | Com. Ex. 4 | Com. Ex. 5 | Com. Ex. 6 | Com. Ex. 7 |
|---|---|---|---|---|---|---|---|---|
| Silicone resin | Resin (base resin KJR-9022X-5:curing | 3.00 | | | | | | |
| First filler | Cordierite ($2MgO \cdot 2Al_2O_3 \cdot 5SiO_2$) (parts by mass) | 3.55 | 1.03 | 1.30 | 3.55 | 1.30 | 1.00 | 7.10 |
| | Average particle size (μm) | 7.8 | 7.8 | 18.0 | 30.0 | 1.7 | 7.8 | 7.8 |
| Second filler | Silicon carbide (SiC) (parts by mass) | 24.27 | 7.70 | 6.00 | 24.27 | 3.00 | 15.00 | 28.00 |
| | Average particle size (μm) | | | | 25.0 | | | |
| Inorganic pigment particle | Carbon black (parts by mass) | 0.003 | 0.003 | 0.003 | 0.075 | 0.003 | 0.003 | 0.003 |
| Total mass of the constituents (parts by mass) | | 30.8 | 11.7 | 10.3 | 30.9 | 7.3 | 19.0 | 38.1 |
| Proportion of inorganic filler in total mass of the constituents (%) | | 90.3 | 74.4 | 70.9 | 90.0 | 58.9 | 84.2 | 92.1 |
| Volume ratio of second filler to first filler | | 3.6 | 4.0 | 2.5 | 3.6 | 1.2 | 8.0 | 2.1 |
| Volume ratio of inorganic filler with respect to combined volume of silicone resin, inorganic filler, and inorganic pigment particle | | 76.3 | 50.1 | 46.8 | 68.5 | 36.2 | 63.7 | 81.2 |
| Amount of inorganic pigmen particle with respect to 100 parts by mass of silicone resin (parts by mass) | | 0.10 | 0.10 | 0.10 | 2.50 | 0.10 | 0.10 | 0.10 |
| Heat dissipating characteristics | Thermal emissivity (—) Far infrared emissivity (—) | 0.94 | 0.92 | 0.9 | 0.94 | 0.83 | 0.89 | 0.89 |
| | Evaluation (—) | Good | Good | Good | Good | Poor | Poor | Poor |
| | Reduction of temperature increase Measured value (° C.) | 120 | 122 | 123 | 124 | 124 | 122 | 123 |
| | Temperature difference ΔT (° C.) | 7.5 | 5.5 | 4.5 | 3.5 | 3.5 | 5.5 | 4.5 |
| | Percentage reduction of temperature increase (%): | 5.9 | 4.3 | 3.5 | 2.7 | 2.7 | 4.3 | 3.5 |
| | Heat dissipation Evaluation (—) | Good | Moderate | Moderate | Poor | Poor | Moderate | Moderate |
| Overall evaluation | Evaluation (—) | Excellent | Good | Good | Poor | Poor | Poor | Poor |

Table 2 represents the results of the experiments conducted for Examples to examine how the properties of the inorganic fillers, including average particle size and mixture ratio, affect the evaluation results.

Examples 1, 3, and 4 had moderate or better evaluation results for reduction of temperature increase, whereas the evaluation result for reduction of temperature increase was poor in Comparative Example 4. This is probably because Examples 1, 3, and 4 contained the inorganic fillers in an amount of 46.8 volume % or more. By being contained in such a proportion, the inorganic fillers presumably are more likely to be in contact with each other, and increase the heat transfer rate in the coating, improving the emissivity of the resin composition 1, and increasing the ability to reduce temperature increase. Examples 1, 3, and 4 had moderate or better evaluation results for thermal emissivity and reduction of temperature increase, and the overall evaluation was good or excellent. In contrast, Comparative Example 7 had a poor evaluation result for thermal emissivity. This is probably because Examples 1, 3, and 4 contained the inorganic fillers in an amount of 76.3 volume % or less. By containing the silicone resin 3 in sufficient amounts, the composition must have provided sufficient adhesion for the object to be coated with the composition, and improved the ease of handling. The result therefore showed that the desirable filler content was 46.8 volume % to 76.3 volume % with respect to the total volume of the resin composition 1.

Examples 1, 3, and 4 contained the second filler 5 in a volume ratio of 2.5 or more with respect to the first filler 4. By containing a sufficient amount of second filler 5, the resin composition 1 must have increased its thermal conductivity, and increased the thermal radiation efficiency at the surface layer of the resin composition 1. Examples 1, 3, and 4 all had good evaluation results for thermal emissivity, whereas the evaluation result for thermal emissivity was poor in Comparative Example 6. This is probably because Examples 1, 3, and 4 contained the second filler 5 in a volume ratio of 4.0 or less with respect to the first filler 4. The sufficient amount of first filler 4 near the surface of the resin composition 1 opposite the surface contacting the heat generating device 7 must have improved the emissivity of the resin composition 1. The result therefore showed that the desired volume ratio of the second filler 5 to the first filler 4 was 2.5 to 4.0.

In contrast to Examples 1, 3, and 4 that had moderate or better evaluation results for thermal emissivity and reduction of temperature increase, Comparative Example 5 had poor evaluation results for both thermal emissivity and reduction of temperature increase. This is probably because the cordierite used in Examples 1, 3, and 4 had a particle size of 7.8 μm or more. With such a particle size, desirable wettability must have been maintained for the silicone resin 3 during kneading, enabling sufficient kneading. This must have prevented the inorganic fillers in the coating from existing as an aggregate and improved the ability of the resin composition 1 to reduce temperature increase. Examples 1, 3, and 4 all had moderate or better evaluation results for reduction of temperature increase, whereas the evaluation result for reduction of temperature increase was poor in Comparative Example 4. This is probably because the cordierite used in Examples 1, 3, and 4 had a particle size of 18 μm or less. Because the first filler 4 was significantly smaller than the second filler 5, the first filler 4 must have been more easily distributed near the surface of the resin composition 1 opposite the surface contacting the heat generating device 7 and improved the efficiency of thermal radiation into the atmosphere. The result therefore showed that the desired particle size of the first filler 4 was 7.8 μm to 18 μm.

TABLE 3

| Main constituents | Details | Ex. 2 | Ex. 5 | Ex. 6 | Com. Ex. 8 | Com. Ex. 9 | Com. Ex. 10 | Com. Ex. 11 | Com. Ex. 12 |
|---|---|---|---|---|---|---|---|---|---|
| Silicone resin | Resin (base resin KJR-9022X-5:curing agent C-9022X-5 = 10:1) (parts by mass) | | | | 3.00 | | | | |
| First filler | Cordierite (2MgO•2Al$_2$O$_3$•5SiO$_2$) (parts by mass) | | | | 1.03 | | | | |
| | Average particle size (μm) | | | | 7.8 | | | | |
| Second filler | Silicon carbide (SiC) (parts by mass) | | | | 7.70 | | | | |
| | Average particle size (μm) | 25.0 | 9.5 | 25.0 | 5.0 | 30.0 | | 25.0 | |
| | Purity | 99.8 | 92.0 | 99.8 | 95.0 | 90.0 | | 99.8 | |
| Inorganic pigment particle | Carbon black (parts by mass) | | | 0.003 | | | | 0.003 | |
| | Average particle size (nm) | 39.5 | 28.0 | 39.5 | | | | 34.0 | 22.0 |
| | Specific surface area (m$^2$/g) | 800.0 | 84.0 | 800.0 | | | | 1270.0 | 99.0 |
| | Titanium black (parts by mass) | | | | | | 0.03 | | |
| | Average particle size (nm) | | | | | | 100.0 | | |
| | Specific surface area (m$^2$/g) | | | | | | 25.0 | | |
| | Total mass of the constituents (parts by mass) | | | | 11.7 | | | | |
| | Proportion of inorganic filler in total mass of the constituents (%) | | | | 74.4 | | | | |
| | Volume ratio of second filler to first filler | | | | 4.0 | | | | |
| | Volume ratio of inorganic filler with respect to combined volume of silicone resin, inorganic filler, and inorganic pigment particle | | | | 50.1 | | | | |
| | Amount of inorganic pigment particle with respect to 100 parts by mass of silicone resin (parts by mass) | | | | 0.03 | | | | |
| Heat dissipating characteristics | Thermal emissivity (—) Far infrared emissivity (—) | 0.91 | 0.91 | 0.9 | 0.89 | 0.89 | 0.85 | 0.9 | 0.92 |
| | Evaluation (—) | Good | Good | Good | Good | Poor | Poor | Good | Good |
| | Reduction of temperature increase — Measured value (° C.) | 121 | 121.5 | 122 | 124 | 124.2 | 125 | 124 | 124.5 |
| | Temperature difference ΔT (° C.) | 6.5 | 6 | 5.5 | 3.5 | 3.3 | 2.5 | 3.5 | 3 |
| | Percentage reduction of temperature increase (%): Heat dissipation | 5.1 | 4.7 | 4.3 | 2.7 | 2.6 | 2.0 | 2.7 | 2.4 |
| | Evaluation (—) | Good | Moderate | Moderate | Poor | Poor | Poor | Poor | Poor |
| | Overall evaluation Evaluation (—) | Excellent | Good | Excellent | Poor | Poor | Poor | Poor | Poor |

Table 3 represents the results of the evaluations conducted for Examples using the same cordierite (particle size of 7.8 μm) used as first filler 4 in Example 1, and fillers of different particle sizes and purities as second filler 5.

Examples 2, 5, and 6 all had moderate or better evaluation results for reduction of temperature increase, whereas the evaluation result for reduction of temperature increase was poor in Comparative Example 9. This is probably because the second filler 5 used in Examples 2, 5, and 6 had a purity of 92% or more, and rendered itself sufficiently thermally conductive, producing desirable reduction of temperature increase. Examples 2, 5, and 6 all had moderate or better evaluation results for reduction of temperature increase, whereas the evaluation result for reduction of temperature increase was poor in Comparative Example 8. This is probably because the second filler 5 used in Examples 2, 5, and 6 had a particle size of 9.5 μm or more. Because the second filler 5 was significantly larger than the first filler 4, the second filler 5 must have been more easily distributed near the surface of the resin composition 1 contacting the heat generating device 7, and efficiently transferred the generated heat from the heat generating device 7 into the resin composition 1. In contrast to Examples 2, 5, and 6 that had moderate or better evaluation results for reduction of temperature increase, Comparative Example 9 had a poor evaluation result for reduction of temperature increase. This is probably because the second filler 5 used in Examples 2, 5, and 6 had a particle size of 25 μm or less, reducing the gap between the second fillers 5. This must have maintained sufficient thermal conductivity in the coating of the resin composition 1 and improved the ability to reduce temperature increase. The result therefore showed that the second filler 5 is desirably a SiC having an average particle size of 9.5 μm to 25 μm, and a purity of 92% or more.

Examples 2, 5, and 6 all had moderate or better evaluation results for reduction of temperature increase, whereas the evaluation result for reduction of temperature increase was poor in Comparative Example 12. This is probably because the inorganic pigment particles 6 had a particle size of 22 nm or more in Examples 2, 5, and 6. With such a particle size, desirable wettability must have been maintained for the silicone resin 3 during kneading, enabling sufficient kneading. This must have prevented the inorganic fillers in the coating from existing as an aggregate and improved the ability of the resin composition 1 to reduce temperature increase. With an average particle size of 39.5 nm or less in Examples 2, 5, and 6, the inorganic pigment particles 6 must have been prevented from forming an aggregate, increasing the number of contact points for the inorganic fillers. This must have provided sufficient thermal conductivity for the resin composition 1 and increased the ability to reduce temperature increase.

Examples 2, 5, and 6 all had good evaluation results for thermal emissivity, whereas the evaluation result for thermal emissivity was poor in Comparative Example 10. This is probably because the inorganic pigment particles 6 had a specific surface area of 84 m$^2$/g or more in Examples 2, 5, and 6, allowing the surface of the resin composition 1 to have a larger heat dissipating area that contributes to thermal radiation, and improving the thermal radiation efficiency. In contrast to Examples 2, 5, and 6 that had good evaluation results for thermal emissivity, the evaluation result for thermal emissivity was poor in Comparative Example 11. This is probably because the inorganic pigment particles 6 had a specific surface area of 800 m²/g or less, producing a particle surface area that is not overly large, and maintaining desirable wettability for the silicone resin 3 during kneading.

From these results, it was found that the resin composition 1 containing the silicone resin 3, the inorganic filler, and the inorganic pigment particles 6 is preferably one in which the inorganic filler includes the first filler 4 having thermal emissivity, the second filler 5 having thermal conductivity, the second filler 5 is contained in a volume ratio of 2.5 or more and 4.0 or less with respect to the first filler 4, and in which the inorganic filler is contained in a proportion of 46.8 volume % or more and 76.3 volume % or less with respect to the total volume of the resin composition 1. With such a configuration, the resin composition 1 can have a very high far infrared emissivity, and excellent ease of handling. The resin composition 1 of the embodiment of the present disclosure is capable of dissipating the heat of the heat generator 12 to outside by means of thermal radiation and reducing temperature increase.

The resin composition 1 of the embodiment of the present disclosure can be used to dissipate the heat of the electronic component 2, and is applicable for heat dissipation in small, light, and thin devices, such as smartphones and tablets, that cannot be equipped with a fan or a heatsink.

What is claimed is:

1. A resin composition comprising a silicone resin, an inorganic filler, and an inorganic pigment particle, the inorganic filler including a first filler having thermal emissivity, and a second filler having thermal conductivity, wherein the second filler is contained in a volume ratio of 2.5 or more and 4.0 or less with respect to the first filler, the inorganic filler being contained in a proportion of 46.8 volume % or more and 76.3 volume % or less with respect to a combined volume of the silicone resin, the inorganic filler, and the inorganic pigment particle, wherein the first filler is an oxide having an average particle size of 7.8 μm or more and 18 μm or less, and containing at least two elements selected from the group consisting of aluminum, magnesium, and silicon, wherein the second filler is a SiC having an average particle size of 9.5 μm or more and 25 μm or less, and a purity of 92% or more, and wherein the inorganic pigment particle has an average particle size of 28 nm or more and 39.5 nm or less, and a specific surface area of 84 m²/g or more and 800 m²/g or less.

2. The resin composition according to claim 1, wherein the inorganic pigment particle is contained in a proportion of 0.1 parts by mass or more and 2.0 parts by mass or less with respect to 100 parts by mass of the silicone resin.

3. An electronic component comprising the resin composition of claim 1.

4. An electronic device comprising the electronic component of claim 3.

5. The resin composition according to claim 1, wherein the silicone resin is contained in the resin composition in a proportion of 23.2 volume % or more and 52.1 volume % or less with respect to a total volume of the resin composition.

6. The resin composition according to claim 1, wherein the first filler has a far infrared emissivity of 0.8 or more in a wavelength region of 5 to 20 μm.

7. The resin composition according to claim 1, wherein the first filler has a thermal conductivity of 3.0 W/mK or more.

8. The resin composition according to claim 1, wherein the thermal conductivity of the second filler is 200 W/mK or more.

9. The resin composition according to claim 3, wherein the second filler has a far infrared emissivity of 0.8 or more in a wavelength region that contributes to a heat transfer of the electronic component.

10. The resin composition according to claim 1, wherein the inorganic pigment has a far infrared emissivity of 0.7 or more.

* * * * *